(12) United States Patent
Tan et al.

(10) Patent No.: US 8,233,569 B2
(45) Date of Patent: Jul. 31, 2012

(54) REALTIME SPECTRUM TRIGGER SYSTEM ON REALTIME OSCILLOSCOPE

(75) Inventors: Kan Tan, Beaverton, OR (US); John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 1347 days.

(21) Appl. No.: 11/529,855

(22) Filed: Sep. 28, 2006

(65) Prior Publication Data
US 2008/0082278 A1 Apr. 3, 2008

(51) Int. Cl.
*H03D 1/00* (2006.01)
(52) U.S. Cl. ............... 375/339; 702/76; 702/1; 702/57; 702/66; 702/75
(58) Field of Classification Search ............... 375/132, 375/339
See application file for complete search history.

(56) References Cited

U.S. PATENT DOCUMENTS

| 5,103,403 A | | 4/1992 | Morton | |
|---|---|---|---|---|
| 5,770,971 A | * | 6/1998 | McNicol | 330/52 |
| 5,866,907 A | * | 2/1999 | Drukier et al. | 250/366 |
| 6,489,610 B1 | * | 12/2002 | Barofsky et al. | 250/287 |
| 2005/0193047 A1 | * | 9/2005 | Fu et al. | 708/300 |
| 2006/0129355 A1 | * | 6/2006 | Hillman et al. | 702/185 |

FOREIGN PATENT DOCUMENTS

| EP | 1 669 764 | * | 6/2006 |
|---|---|---|---|
| EP | 1672376 A1 | | 6/2006 |

* cited by examiner

*Primary Examiner* — Shuwang Liu
*Assistant Examiner* — Nader Bolourchi
(74) *Attorney, Agent, or Firm* — Francis I. Gray; Thomas F. Lenihan

(57) ABSTRACT

A realtime spectrum trigger system on a realtime oscilloscope considers both the magnitude and phase of an input signal having a periodic component so that successive acquisitions of the input signal are time aligned. A user inputs a frequency, threshold and phase for triggering on the periodic component. Input signal samples are filtered by quadrature filters according to the frequency input to produce quadrature signal components. The square of the magnitude of the input signal is computed from the quadrature signal components, as well as the phase ratio and sign, for comparison with calculated values. When enabled by the magnitude of the input signal, a phase crossing determinator compares the phase ratio and sign with calculated values to determine the phase crossing to generate a trigger, resulting in successive acquisitions of the input signal being in time alignment.

16 Claims, 5 Drawing Sheets

REALTIME SPECTRUM TRIGGER SYSTEM ON REALTIME OSCILLOSCOPE

BACKGROUND OF THE INVENTION

The present invention relates to oscilloscope trigger systems, and more particularly to a realtime spectrum trigger system on a realtime oscilloscope.

Realtime oscilloscopes have comprehensive trigger systems to help users obtain stable waveforms for display, quickly capture abnormal behavior, etc. However, these trigger systems are unable to trigger on a periodic signal buried in noise so that subsequent acquisitions of the signal are in time alignment, as shown in FIG. 1. There is no spectrum trigger on realtime oscilloscopes. New realtime spectrum analyzers, such as those manufactured by Tektronix, Inc. of Beaverton, Oreg., have a spectrum trigger that helps to capture frequency events and also display signals in the time domain. However only the magnitude spectrum is considered, while the phase spectrum is not. Phase in the frequency domain corresponds to time delays in the time domain. Time alignment, i.e., phase alignment, is required for the realtime oscilloscope to put multiple acquisitions of a signal in a waveform database.

What is desired is a spectrum trigger system for a realtime oscilloscope that considers both magnitude and phase such that time alignment between successive acquisitions is achieved.

BRIEF SUMMARY OF THE INVENTION

Accordingly the present invention provides a realtime spectrum trigger system on a realtime oscilloscope that takes into consideration both magnitude and phase so that time alignment between successive acquisitions of an input signal having a periodic component in the presence of noise may be achieved. A user inputs a desired frequency, or the desired frequency may be selected automatically from the input signal, a magnitude threshold and a desired phase for triggering on the periodic component. From the frequency, magnitude and phase a set of filter coefficients is calculated, a squared threshold magnitude value is calculated, and a ratio of the signal components representing the periodic component as well as the sign of one of the signal components is calculated. These values are input to a hardware system where the input signal is digitized to produce signal samples and the samples are filtered by quadrature FIR filters according to the calculated filter coefficients to produce the signal components. The square of the magnitude of the frequency of the periodic component is calculated as well as the component ratio and sign. The square of the magnitude is compared with the calculated square of the input threshold to generate an enable signal for a phase crossing determinator. The ratio and sign of the signal component samples are computed when the phase crossing determinator is enabled, and compared with the calculated ratio and sign to determine the phase crossing. Interpolation is included to provide a more accurate phase crossing time between samples. When the signal phase equals the desired phase, a trigger is generated to acquire the input signal, resulting in successive acquisitions of the input signal being in time alignment.

The objects, advantages and other novel features of the present invention are apparent from the following detailed description when read in conjunction with the appended claims and attached drawing.

DETAILED DESCRIPTION OF THE INVENTION

Figure 1:
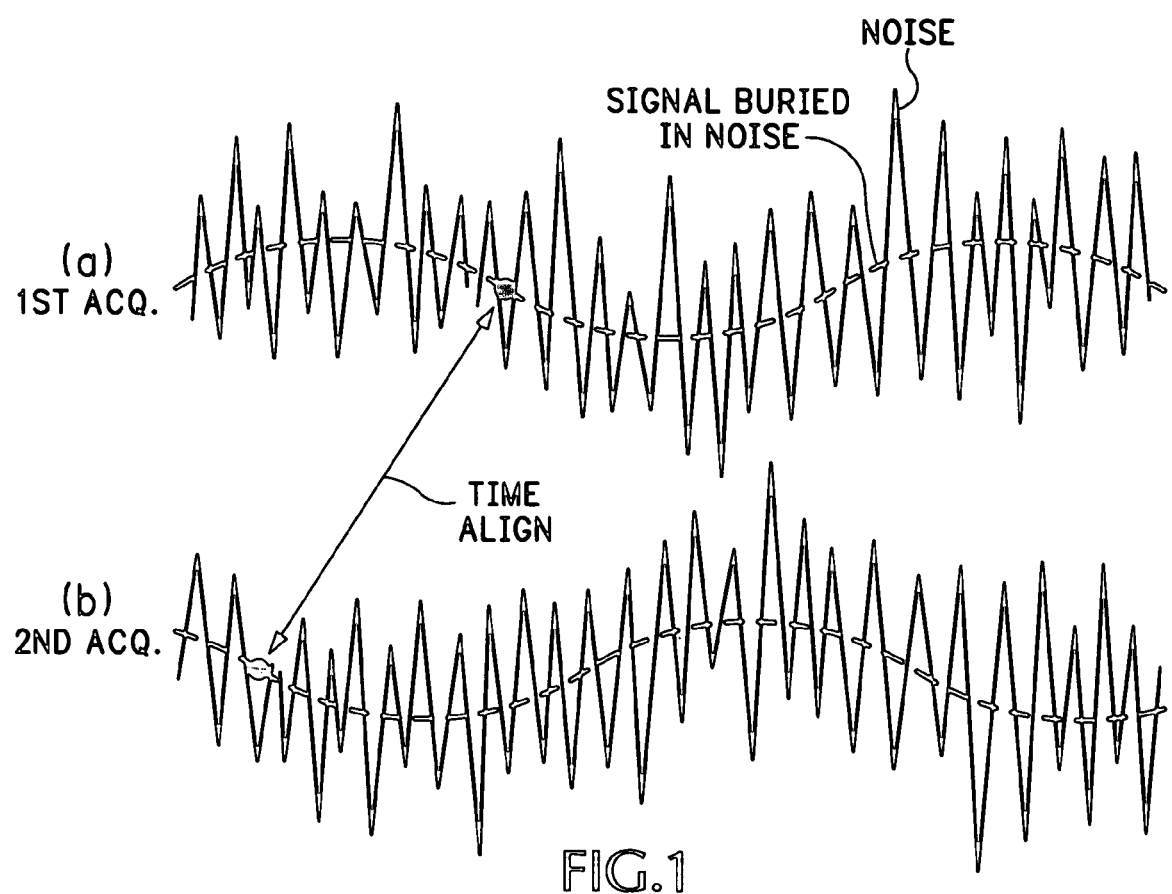
FIG. 1 is a graphic view of successive acquisitions (a) and (b) of a periodic signal in the presence of noise using a time domain trigger.
Figure 2:
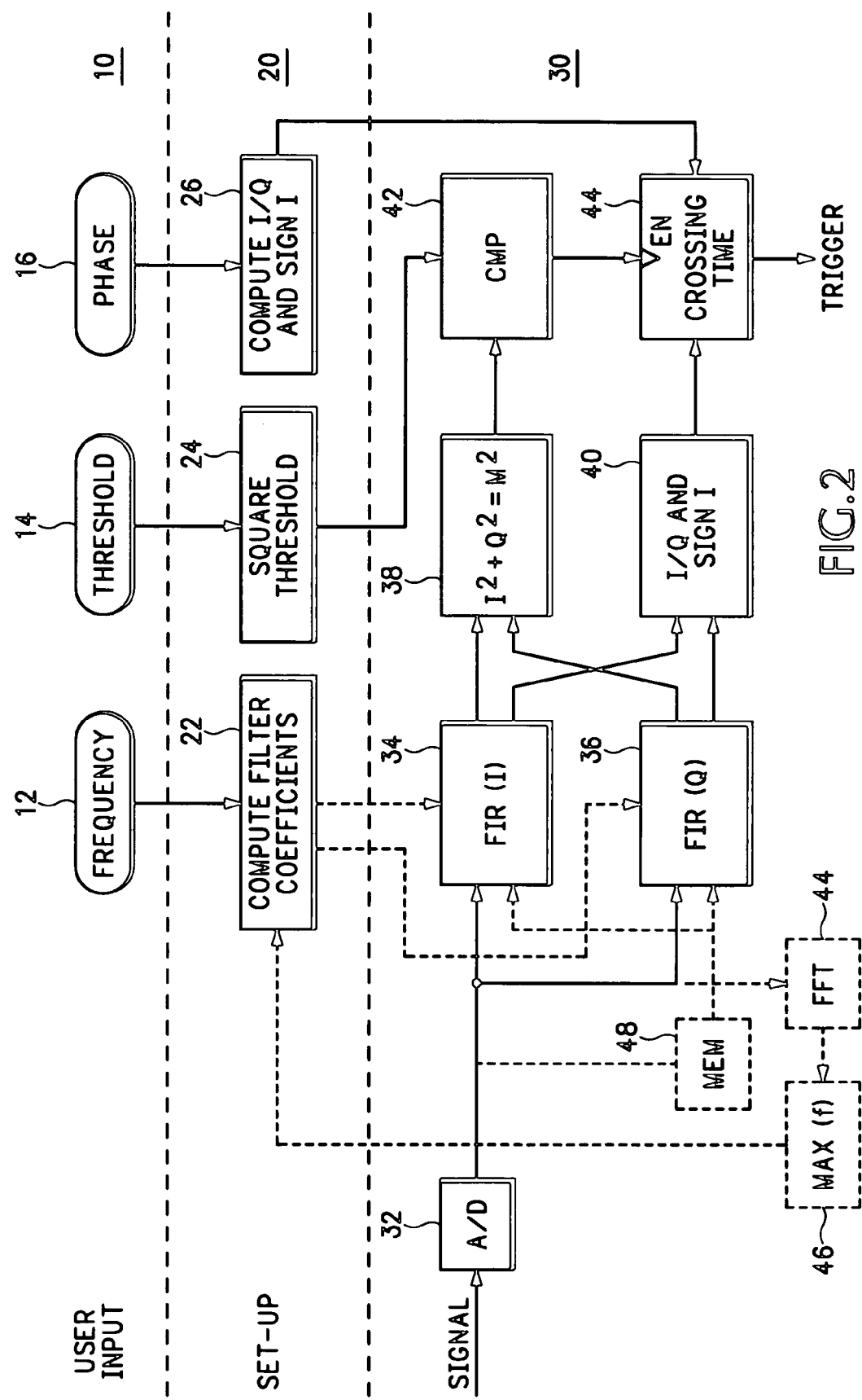
FIG. 2 is a block diagram view of a realtime spectrum trigger system on a realtime oscilloscope according to the present invention.
Figure 3:
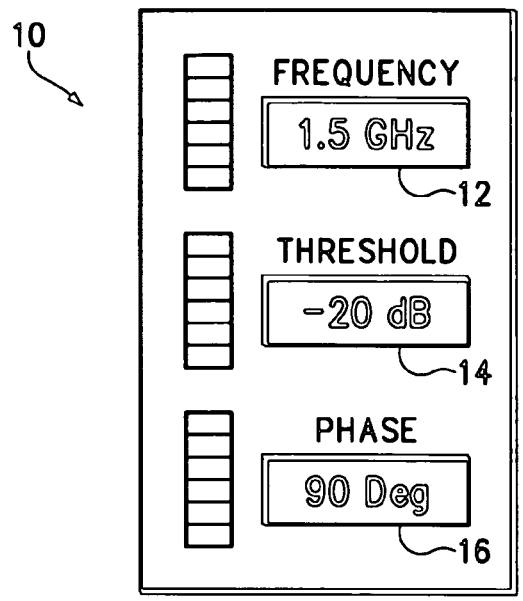
FIG. 3 is a plan view of a user interface for the realtime spectrum trigger system according to the present invention.
Figure 4:
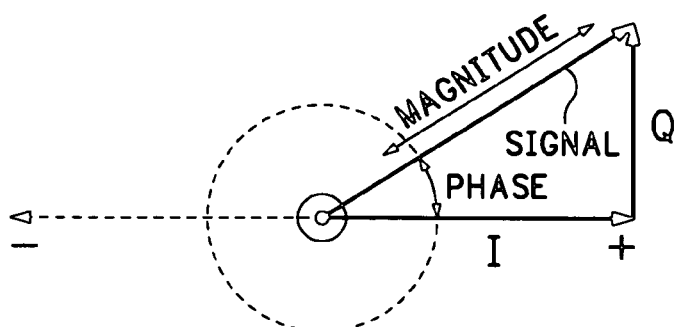
FIG. 4 is a graphic view illustrating the representation of a complex signal as a vector.

Referring now to FIG. 2 a realtime spectrum trigger system on a realtime oscilloscope has a user input section 10, such as the user interface shown in FIG. 3, where a user may input a desired trigger frequency 12, magnitude threshold 14 at the trigger frequency and phase crossing 16 at the trigger frequency. Based upon the user inputs a setup section 20 computes filter parameters 22 from the user selected frequency, a squared threshold 24 from the user input magnitude threshold and a quadrature I/Q ratio and sign of the I component from the user selected phase crossing. In the setup section 20 the realtime oscilloscope performs a couple of computations and then uses the computation results in the oscilloscope hardware. A discrete Fourier transform (DFT) is implemented to get a spectrum at the desired trigger frequency.

$$(\text{DFT}) X(k) = \sum_{m=0-(N-1)} x(m) W_N^{km} = W_N^{-kN} \sum_{m=0-(N-1)} x(m) W_N^{km} = \sum_{m=0-(N-1)} x(m) W_N^{-k(N-m)} \quad (1)$$

$$(\text{Euler}) W_N^{-km} = e^{j2\pi km/N} = \cos(2\pi km/N) + j \sin(2\pi km/N) \quad (2)$$

where k is determined by a specified frequency f and an oscilloscope horizontal setup of sampling rate $f_s$. Equation (1) represents a discrete Fourier transform (DFT) expressed in the form of a convolution that may be implemented by finite impulse response (FIR) filters. Putting equation (2), which is an Euler function, into equation (1) produces a real part of the spectrum that may be implemented by a first FIR filter (I) whose coefficients are set to $\cos(2\pi km/N)$, $m=0, 1, \ldots, N-1$. The imaginary part of the spectrum in equation (1) may be implemented by a quadrature FIR filter (O) whose coefficients are set to $\sin(2\pi km/N)$, $m=0, 1, \ldots, N-1$. When a complex spectrum is available, the magnitude and phase may be computed using complex functions of square root and arctangent. Equivalent to magnitude and phase are the square of the magnitude in terms of threshold and the ratio of I/Q and sign of I in terms of phase crossing. These values are computed in the respective setup calculations 24, 26 and sent to the realtime trigger hardware 30. FIG. 4 illustrates a complex signal having I and Q components that is expressed in terms of magnitude and phase. A sinusoidal periodic signal may be thought of as a vector that rotates about the zero point of the I/Q axes. The square of the magnitude ($M^2$) is equal to the sum of the squares of the I and Q components ($I^2+Q^2$), and the phase is a function of the ratio of I/Q and the sign of I, i.e., in the first quadrant the ratio is positive as is the sign of I, in the second quadrant the ratio is negative as is the sign of I, in the third quadrant the ratio is positive but the sign of I is negative and in the fourth quadrant the ratio is negative but the sign of I is positive.

Figure 5:
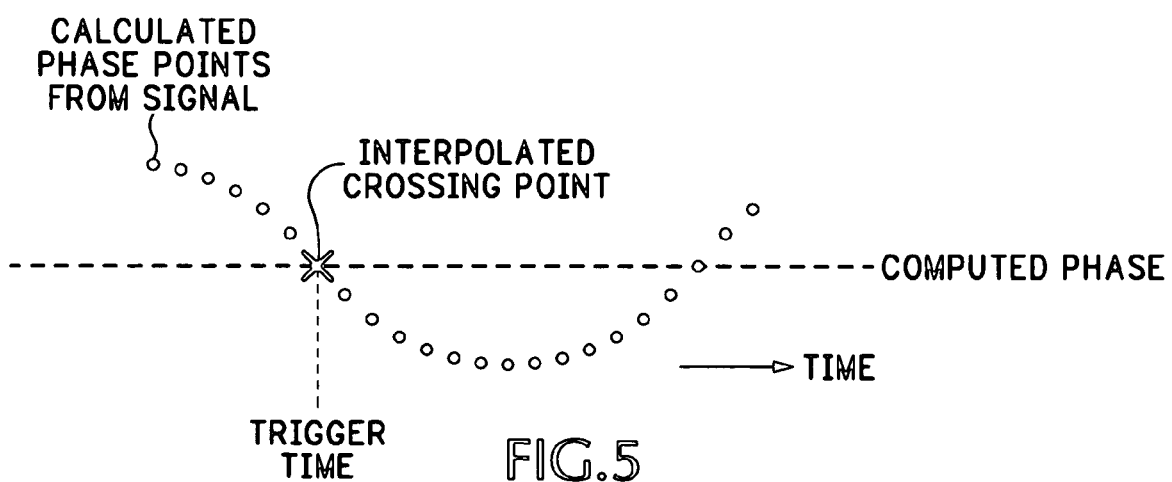
FIG. 5 is a graphic view illustrating interpolation of phase samples to obtain an accurate trigger time according to the present invention.

An analog signal is sampled by an analog to digital converter (A/D) 32, and the resulting digital signal is then filtered through respective quadrature FIR filters 34, 36 to obtain a complex spectrum at the specified frequency. The outputs of the FIR filters 34, 36 are input to a square of magnitude determinator 38 and a phase determinator 40, the phase being the combination of I/Q and sign of I. The output from the magnitude determinator 38 is input to a comparator 42 for comparison with the calculated squared threshold 24 to produce an enable signal when the squared magnitude exceeds the squared threshold, indicating that the desired periodic signal is present. The phase from the phase determinator 40 is input to a crossing time determinator 44. The crossing time determinator 44 also has the calculated phase information 26 as an input and performs an interpolation, as illustrated in FIG. 5, to determine precisely when the phase of the signal corresponds with the calculated phase to produce a trigger signal. The crossing time determinator 44 may be implemented using edge-crossing hardware. The trigger signal is used to trigger data acquisition and the time interpolation hardware in the crossing time determinator compensates for the fraction of sample time to provide accurately aligned waveforms on successive acquisitions.

An optional setting is to apply a window function prior to the DFT FIR filters 34, 36 to reduce spectrum leakage. Various window functions, such as Hann, Hamming or Gaussian window functions, may be configured. The window function may be combined with the DFT function and implemented as part of the FIR filters 34, 36.

If the input signal is to be triggered on multiple frequencies, such as when monitoring a frequency hopping system, a fast Fourier transform (FFT) may be implemented instead of the DFT. Phase information is considered to keep alignment between subsequent acquisitions. This alignment is critical for multiple acquisition operations, such as averaging, equivalent time acquisition, etc.

When the user is not sure which frequency to specify for the trigger function, a spectrum analysis function in the instrument may be used to find a proper frequency where the input signal has a high power density, thus making frequency selection for the trigger function automatic. The digitized samples from the A/D converter 32 are input to a fast Fourier transform (FFT) function 44 to produce a frequency spectrum for the input signal. The frequency from the frequency spectrum having the maximum spectral power is selected by a maximum (f) function 46. The selected frequency is input automatically to the filter coefficient computation 22.

The ability to implement the spectrum trigger enables the realtime oscilloscope to acquire certain events that occur in the frequency domain. For example the oscilloscope may trigger on a burst of a particular harmonic that might represent signal distortion. For the frequency hopping system the spectrum trigger may capture each harmonic at a time.

Figure 6B:
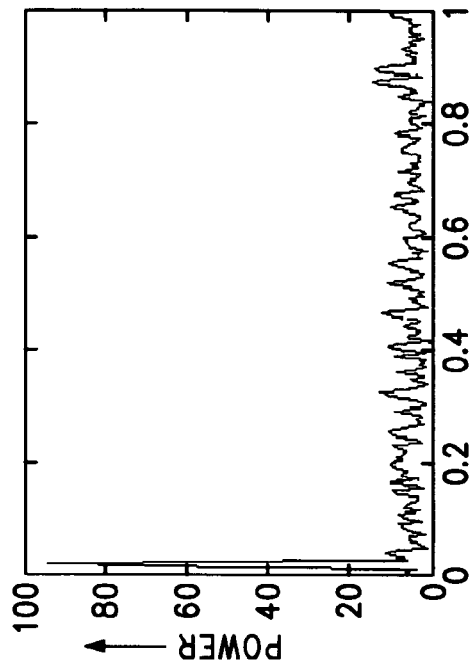
FIGS. 6a and 6b are respective time and frequency domain displays for a noisy signal.
Figure 6A:
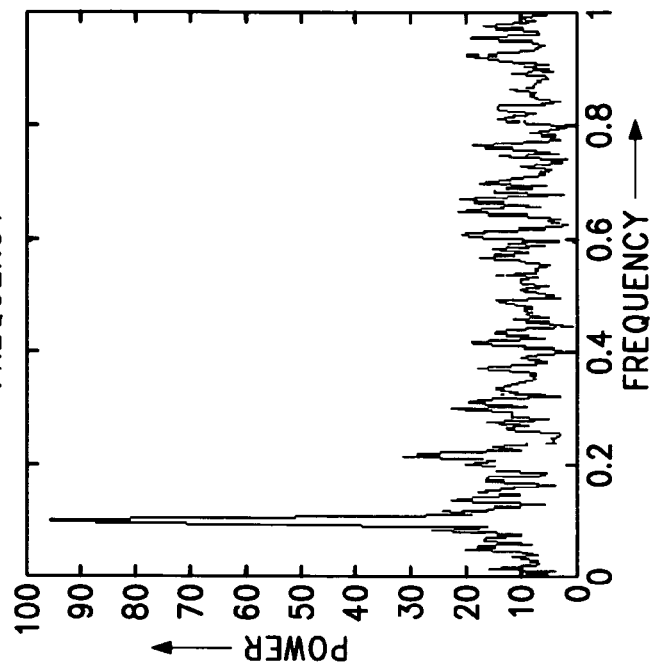

The spectrum trigger improves the accuracy of the trigger on a noisy periodic signal, as illustrated in FIGS. 6*a* and 6*b*. The accuracy of the time domain edge trigger may be severely deteriorated, since the noisy edges make edge detection unreliable. Even a clock recovery system in the realtime oscilloscope may not work properly when waveform edges are too noisy.

Figure 7B:
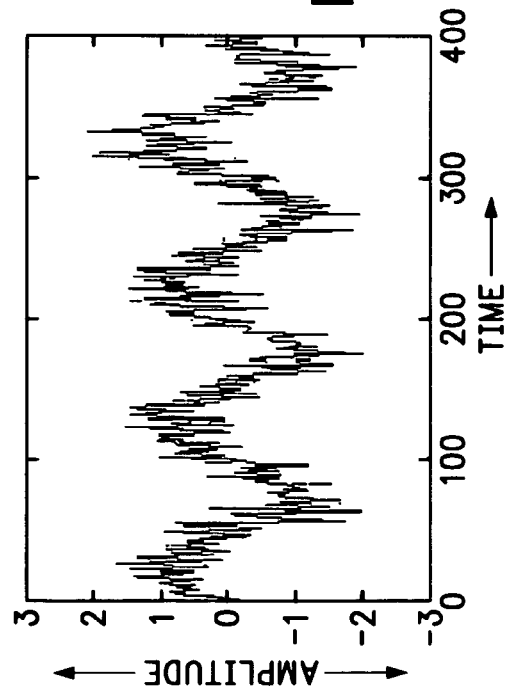
FIGS. 7a and 7b are respective time and frequency domain displays for a signal buried by noise.
Figure 7A:
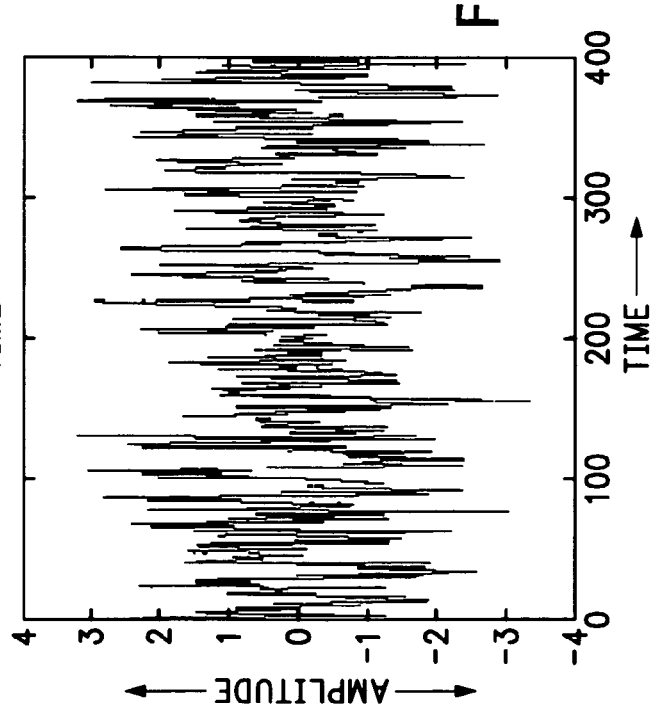

The spectrum trigger also enables oscilloscopes to trigger on a periodic signal buried in noise, as shown in FIGS. 7*a* and 7*b*. The signal is so buried in noise that no edge is visible in the time domain. However the signal stands out off the noise floor in the frequency domain. The time domain trigger may work if noise concentrates in high frequencies and may be filtered out with a lowpass filter. However the spectrum trigger assures accurate signal acquisition and ignores all spectrums at frequencies that are not of interest. Also accurate time alignment is insured, so a clear view of the signal in the time domain may be acquired using an averaging mode. The noise is averaged out, leaving the signal of interest in the time domain view.

The implementation described above with respect to FIG. 2 is a digital implementation that may be executed either by hardware or by software. Where the FIR filters 34, 36 operate at a slower rate than the ADC 32, the output from the ADC may be input into a buffer memory 48, the contents of which are then processed as indicated between acquisitions. In other words the ADC 32 digitizes the input signal and stores the data samples in the buffer memory 48, and the contents of the buffer memory are then processed as indicated above when full. While the contents of the buffer memory 48 are being processed, the sample data from the ADC 32 is not stored, i.e., is lost.

Figure 8:
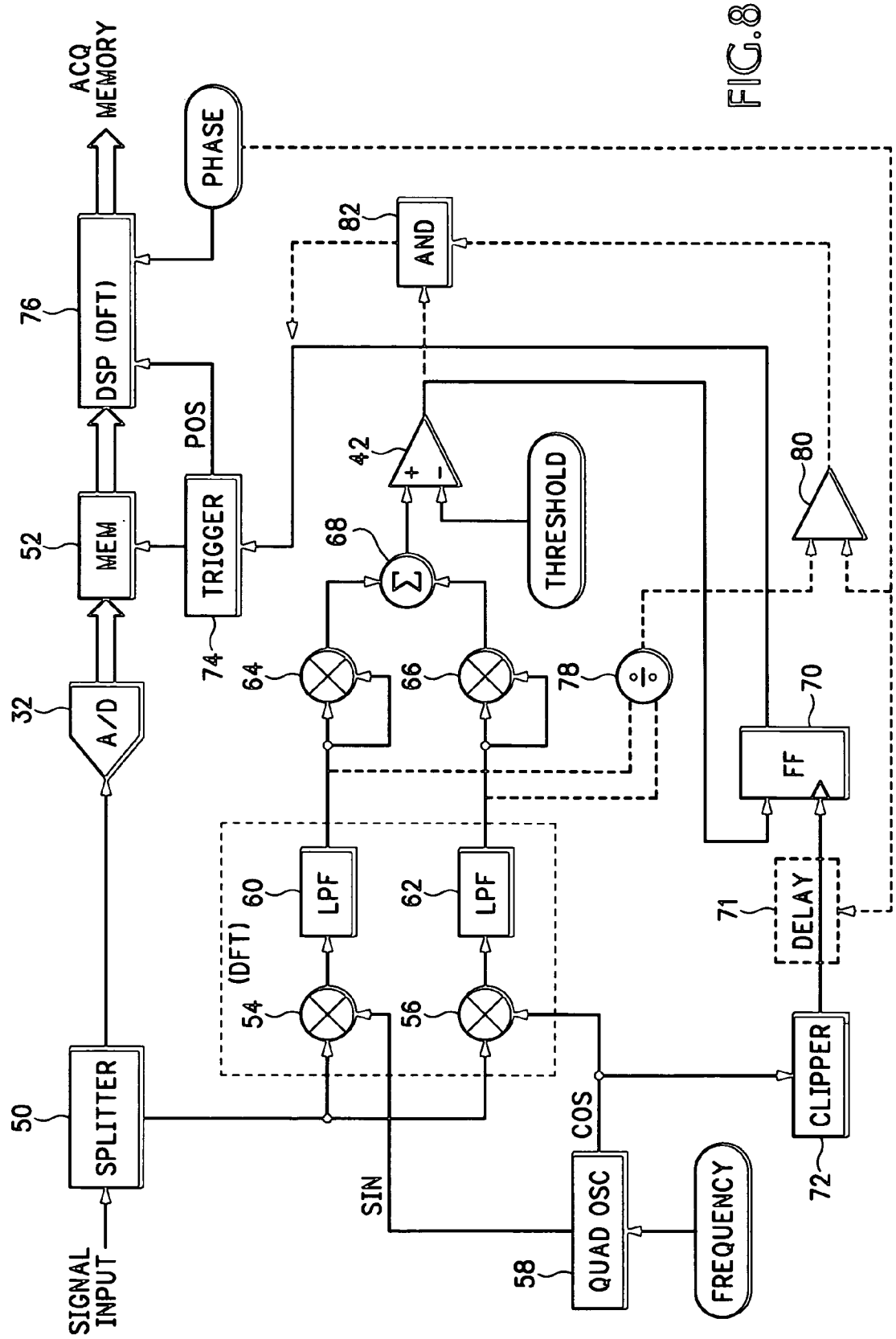
FIG. 8 is a block diagram view of an alternative embodiment for the realtime spectrum trigger system according to the present invention.

An analog implementation is shown in FIG. 8 where the input signal is input to a splitter 50 to form two signal streams. One of the signal streams is input to the ADC 32, digitized and stored in a recirculating memory 52. The other signal stream is input to a pair of quadrature mixers 54, 56 together with respective quadrature components of a reference signal from an oscillator 58. The outputs from the mixers 54, 56 are input to respective lowpass filters 60, 62 followed by squaring circuits 64, 66. The mixers 54, 56 together with lowpass filters 60, 62 perform a DFT function similar to the FIR filters 34, 36 of FIG. 2. The outputs of the squaring circuits 64, 66 are input to a summer 68 to produce $M^2=I^2+Q^2$, i.e., the magnitude of the input signal squared. As before the squared magnitude is input to the comparator 42 for comparison with the specified magnitude threshold. The output from the comparator 42 is input to a gate 70 that is controlled by one of the components from the oscillator 58, the signal of which is converted to a square wave via a clipper 72 so that the control signal occurs at the zero crossing of the reference signal. When the desired frequency is detected from the comparator 42, the gate 70 provides a trigger event signal to a trigger circuit 74 that generates a trigger signal for stopping storage in the recirculating memory 52 that is in phase with the reference signal. Alternatively a delay circuit 71 may be inserted between the clipper 72 and the gate 70, with the amount of delay being determined by the desired phase, so that the trigger circuit 74 generates the trigger circuit at the desired phase of the reference signal. The trigger circuit 74 provides a trigger position signal to a digital signal processor (DSP) 76. The DSP 76 processes the sample data from the recirculating memory 52 using a DFT function that may adjust the sample data to be at the desired phase for each acquisition. The DSP 76 provides the adjusted sample data to the acquisition memory for further processing.

Alternatively the outputs from the lowpass filters 60, 62 may be input to a divider 78 to obtain I/Q, and the resulting ratio is input to another comparator 80 for comparison with the phase parameter. The outputs from the two comparators 42, 80 may be combined, such as by an AND gate 82, to provide the trigger event to the trigger system 74 in phase with the desired phase of the reference signal. In all cases each acquisition that is passed on to the acquisition memory is related to the same phase of the reference signal, i.e., the multiple acquisitions are time aligned.

As a result an enhanced trigger system that includes the spectrum trigger accurately triggers on signals such as burst waveforms, noisy waveforms and frequency-hopping waveforms in real time, capturing significant events accurately. The accurate trigger from accurate phase alignment improves the performance of multiple acquisition applications. The spectrum trigger that triggers on both magnitude and phase may be applied to other instruments besides realtime oscilloscopes, such as realtime spectrum analyzers. The spectrum trigger may also be used in a post-acquisition mode.

Thus the present invention provides a spectrum trigger for an enhanced trigger system that triggers on a desired frequency signal having both a desired magnitude and phase with respect to a reference signal so that each acquisition of the signal is time aligned with each other acquisition of the signal.

What is claimed is:

1. A realtime spectrum trigger generator for use in a realtime oscilloscope, comprising:
    said realtime oscilloscope including acquisition circuitry, said acquisition circuitry acquiring time domain input signal under test, and including means for converting said input signal under test to a frequency domain signal having quadrature components as a function of a given frequency; and
    means for generating a trigger from the quadrature components as a function of a given threshold and a given phase; wherein said oscilloscope further comprises:
    a recirculating memory for receiving samples of the input signal under test at a first input;
    a trigger circuit having the trigger as an input and providing a trigger position signal as a first output and a stop command as a second output, the stop command being coupled to a second input of the recirculating memory to stop receipt of the samples; and
    a processor having a first input for receiving the samples from the recirculating memory, a second input for receiving the trigger position and a third input for receiving the given phase, the processor providing the samples to an acquisition memory at an output adjusted for time alignment as a function of the given phase.

2. The realtime spectrum trigger generator as recited in claim 1 wherein the converting means comprises a filter having coefficients determined from the given frequency for generating the quadrature components from the input signal.

3. The realtime spectrum trigger generator as recited in claim 2 wherein samples of the input signal under test are stored in said recirculating memory at a first rate, and samples from the memory are processed by the filter at a second, slower rate to generate the quadrature components.

4. The realtime spectrum trigger generator as recited in claim 2 wherein the converting means further comprises:
    means for generating a frequency spectrum from the input signal; and
    means for detecting a frequency within the frequency spectrum having a maximum value as the given frequency.

5. The realtime spectrum trigger generator as recited in claim 2, 3 or 4 wherein the generating means comprises:
    means for obtaining a sum of the squares of the magnitudes of the quadrature components as the magnitude of the frequency domain signal;
    means for comparing the sum of the squares with a square of the given threshold to produce an enable signal when the given frequency is present in the frequency domain signal;
    means for determining a ratio of the magnitudes of the quadrature components; and
    means for producing the trigger as a function of the ratio and the given phase in response to the enable signal.

6. The realtime spectrum trigger generator as recited in claim 1 wherein the converting means comprises means for producing the quadrature signals from the input signal as a function of a reference signal having a frequency determined by the given frequency.

7. The realtime spectrum trigger generator as recited in claim 6 wherein the producing means comprises:
    an oscillator having the given frequency as an input and quadrature components of the reference signal as outputs;
    means for mixing the input signal with the quadrature components of the reference signal to produce quadrature signals; and
    means for lowpass filtering each of the quadrature signals to produce the quadrature components of the frequency domain signal.

8. The realtime spectrum trigger generator as recited in claim 7 wherein the generating means comprises:
    means for obtaining the sum of the squares of the magnitudes of the quadrature components of the frequency domain signal to produce a magnitude value;
    means for comparing the magnitude value with the given threshold to generate a frequency detected signal; and
    means for producing the trigger at the given phase of the reference signal.

9. The realtime spectrum trigger generator as recited in claim 8 wherein the producing means comprises:
    means for converting one of the quadrature components of the reference signal to a square wave; and
    means for generating the trigger on an edge of the square wave when the frequency detected signal is present.

10. The realtime spectrum trigger generator as recited in claim 9 wherein the producing means further comprises means for delaying the square wave as a function of the given phase prior to the generating means.

11. The realtime spectrum trigger generator as recited in claim 8 wherein the producing means comprises:
    means for obtaining a ratio of the magnitudes of the quadrature components; and
    means for generating the trigger signal as a function of the ratio, the given phase and the frequency detected signal.

12. The realtime spectrum trigger generator as recited in claim 7 wherein the means for lowpass filtering comprises a pair of filters having filter coefficients determined by the given frequency for converting the input signal as a common input to the quadrature components as respective outputs.

13. The realtime spectrum trigger generator as recited in claim 12 further comprising:
    a time-to-frequency domain converter having the input signal as an input and a frequency spectrum as an output; and
    a frequency detector having the frequency spectrum as an input and a frequency having a maximum value as an output, the frequency being the given frequency.

14. The realtime spectrum trigger generator as recited in claim 12 wherein the trigger generator comprises:
    a magnitude circuit having inputs coupled to receive the quadrature components from the outputs of the pair of filters and having a squared magnitude value as an output;
    a ratio circuit having inputs coupled to receive the quadrature components from the outputs of the pair of filters and having a magnitude ratio and sign as an output;

a comparator having the squared magnitude value as a first input for comparison with a value derived from the given threshold as a second input to produce an enable signal as an output; and a crossing time circuit having the magnitude ratio and sign as a first input and a computed magnitude ratio and sign derived from the given phase as a second input to produce the trigger as an output.

15. The realtime spectrum trigger generator as recited in claim 14 wherein the trigger generator comprises:

a clipper having an input for receiving one of the quadrature components from the reference oscillator and an output for providing a square wave;

a squaring circuit having as inputs the quadrature components of the frequency domain signal to produce a squared magnitude value as an output;

a comparator having the squared magnitude value as a first input and a squared threshold value derived from the given threshold as a second input and providing a frequency detected signal as an output; and a gate having the frequency detected signal as an input and the square wave as a clock input to provide the trigger as an output.

16. The realtime spectrum trigger generator as recited in claim 14 wherein the trigger generator comprises:

a frequency detection circuit having as inputs the quadrature components of the frequency domain signal and the given threshold to produce a frequency detected signal;

a phase detector having the quadrature components of the frequency domain signal and the given phase as inputs and providing a phase detected signal as an output; and a combiner having as inputs the frequency detected signal and the phase detected signal to produce the trigger as an output.

* * * * *